(12) United States Patent
Kanai

(10) Patent No.: US 9,607,887 B1
(45) Date of Patent: Mar. 28, 2017

(54) METHOD OF MANUFACTURING SEMICONDUCTOR DEVICE

(71) Applicant: KABUSHIKI KAISHA TOSHIBA, Tokyo (JP)

(72) Inventor: Hideki Kanai, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/053,383

(22) Filed: Feb. 25, 2016

Related U.S. Application Data

(60) Provisional application No. 62/215,791, filed on Sep. 9, 2015.

(51) Int. Cl.
*H01L 21/467* (2006.01)
*H01L 21/768* (2006.01)
*H01L 21/02* (2006.01)
*H01L 21/308* (2006.01)

(52) U.S. Cl.
CPC .. *H01L 21/76838* (2013.01); *H01L 21/02356* (2013.01); *H01L 21/3086* (2013.01); *H01L 21/467* (2013.01); *H01L 21/76802* (2013.01); *H01L 21/76892* (2013.01)

(58) Field of Classification Search
CPC ........... H01L 21/02356; H01L 21/0271; H01L 21/3081; H01L 21/3086; H01L 21/32; H01L 21/467; H01L 21/475; H01L 21/76802; H01L 21/76816; H01L 21/76838; H01L 21/76892
See application file for complete search history.

(56) References Cited

U.S. PATENT DOCUMENTS

| | | | |
|---|---|---|---|
| 8,491,987 B2* | 7/2013 | Colburn | H01L 21/0331 428/195.1 |
| 8,703,407 B2* | 4/2014 | Seino | G03F 7/0755 430/324 |
| 8,734,904 B2* | 5/2014 | Cheng | H01L 21/0337 427/256 |
| 2009/0184374 A1* | 7/2009 | Clevenger | H01L 21/31144 257/368 |
| 2015/0228475 A1* | 8/2015 | Ban | H01L 21/0337 216/49 |

FOREIGN PATENT DOCUMENTS

JP      JP 2011-077475      4/2011

* cited by examiner

*Primary Examiner* — Stephen W Smoot
(74) *Attorney, Agent, or Firm* — Finnegan, Henderson, Farabow, Garrett & Dunner LLP

(57) ABSTRACT

In one embodiment, a method of manufacturing a semiconductor device includes forming a convex portion including an interconnect and a first film above a substrate, forming a second film on the convex portion, and forming a concave portion having a first bottom face of the first film and a second bottom face lower than the upper face of the first film in the second film. The method further includes forming a polymer film in the concave portion by using a polymer that includes first and second portions respectively having first and second affinities for the first film, phase-separating the first and second portions to form a first pattern containing the first portion and located on the first bottom face and a second pattern containing the second portion and located on the second bottom face in the polymer film, and selectively removing the first or second pattern.

20 Claims, 16 Drawing Sheets

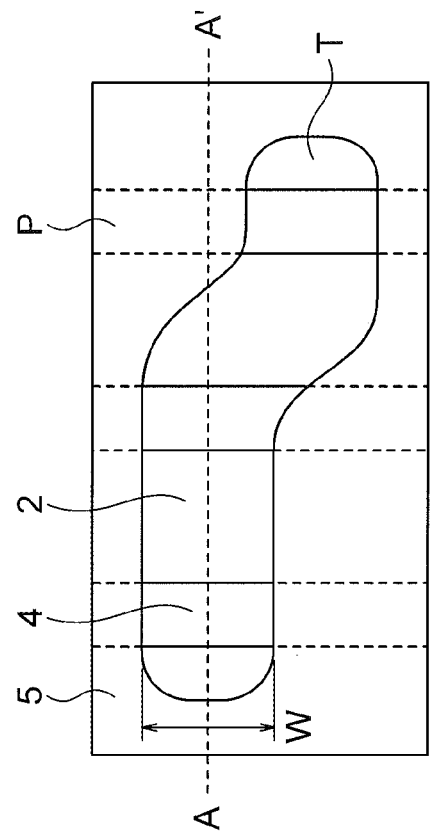
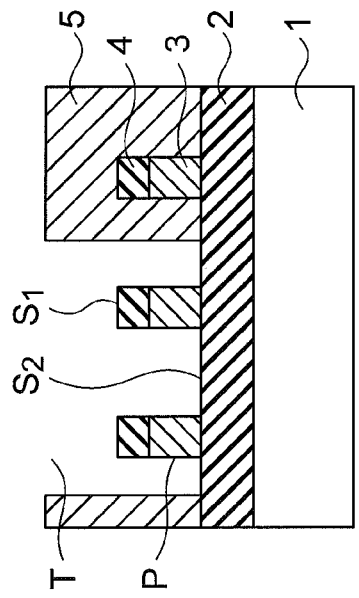
FIG. 3B
FIG. 3A

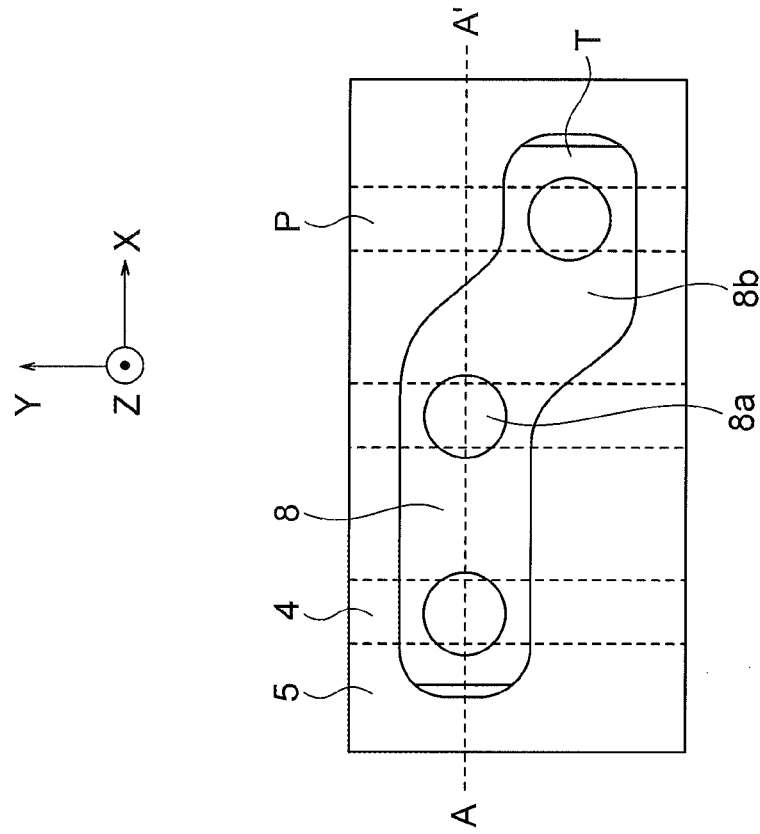
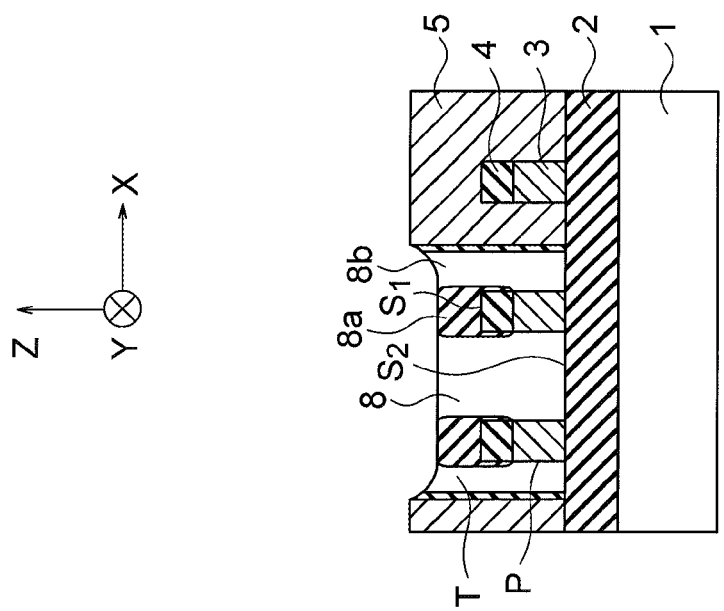
FIG. 5B
FIG. 5A

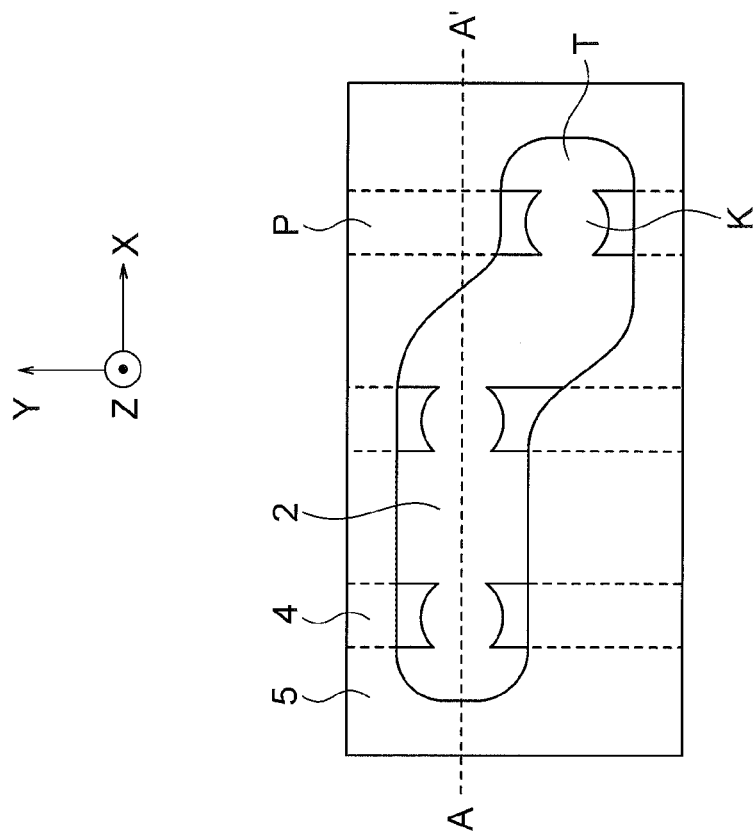
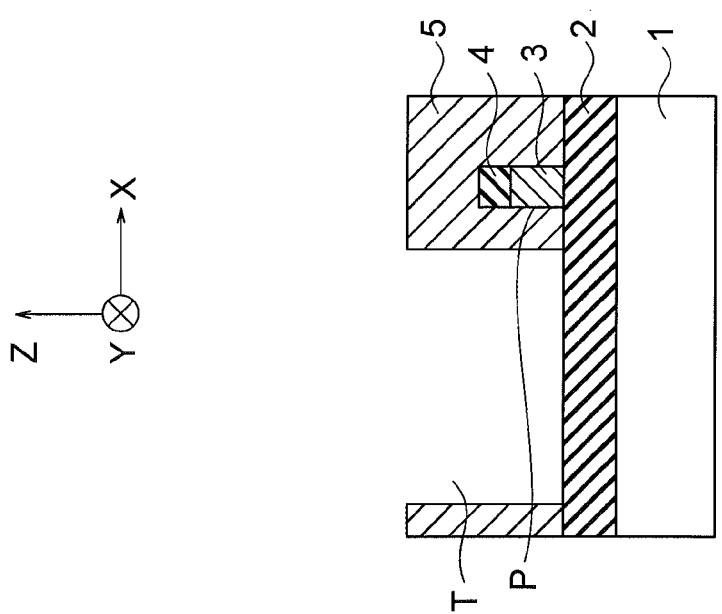
FIG. 8B
FIG. 8A

METHOD OF MANUFACTURING SEMICONDUCTOR DEVICE

CROSS REFERENCE TO RELATED APPLICATION

This application is based upon and claims the benefit of priority from the prior U.S. Provisional Patent Application No. 62/215,791 filed on Sep. 9, 2015, the entire contents of which are incorporated herein by reference.

FIELD

Embodiments described herein relate to a method of manufacturing a semiconductor device.

BACKGROUND

A block copolymer (BCP) is a copolymer including plural types of polymer blocks. For example, if a BCP film in which the composition ratio of two types of monomers is about 30:70 is heated, a columnar pattern called a cylindrical phase is generated in the BCP film due to phase separation in the BCP. Therefore, it is considered to form the pattern on an interconnect to use the pattern for interconnect processing or the like. However, the pattern on the interconnect may be largely shifted in position in this case, which may reduce the yield for the interconnect processing or the like.

BRIEF DESCRIPTION OF THE DRAWINGS

FIGS. 1A to 6B are cross-sectional views and plan views showing a method of manufacturing a semiconductor device of a first embodiment;

FIGS. 7A to 9B are cross-sectional views and plan views showing a method of manufacturing a semiconductor device of a second embodiment;

DETAILED DESCRIPTION

Embodiments will now be explained with reference to the accompanying drawings.

In one embodiment, a method of manufacturing a semiconductor device includes forming a convex portion above a substrate, the convex portion including an interconnect and a first film, and forming a second film on the convex portion. The method further includes forming a concave portion in the second film, the concave portion having a first bottom face that is an upper face of the first film and a second bottom face that is lower than the upper face of the first film, and forming a polymer film in the concave portion by using a polymer that includes a first portion having a first affinity for the first film and a second portion having a second affinity lower than the first affinity for the first film. The method further includes phase-separating the first portion and the second portion to form a first pattern and a second pattern in the polymer film, the first pattern containing the first portion and being located on the first bottom face, the second pattern containing the second portion and being located on the second bottom face, and selectively removing the first or second pattern.

First Embodiment

Figure 1B:
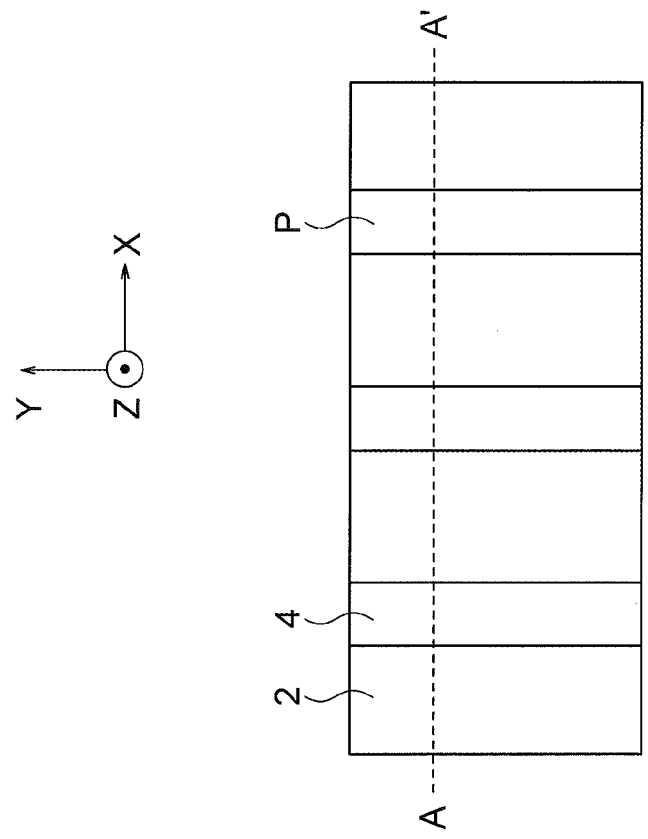
Figure 1A:
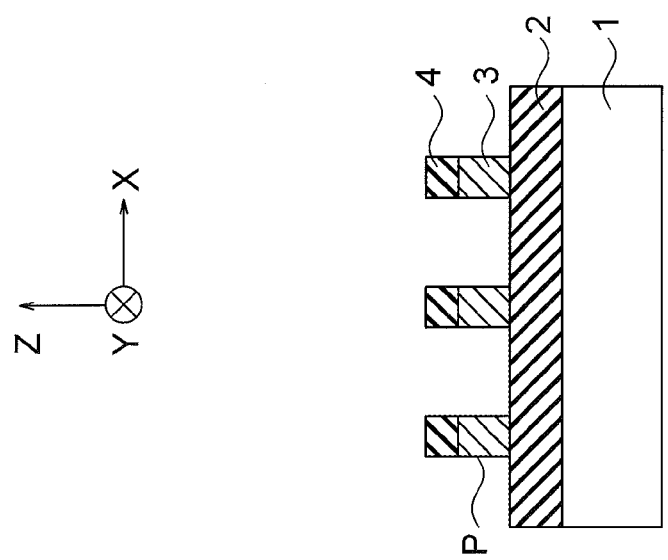

FIGS. 1A to 6B are cross-sectional views and plan views showing a method of manufacturing a semiconductor device of a first embodiment. The cross-sectional view in FIG. 1A shows a cross-section taken along line A-A' in the plan view in FIG. 1B. The same applies to FIGS. 2A to 6B.

An underlying layer 2 is first formed on a substrate 1, and convex portions P are formed on the underlying layer 2 (FIGS. 1A and 1B). Each convex portion P includes an interconnect 3 formed on the underlying layer 2 and a first insulator 4 formed on the interconnect 3. The first insulator 4 is an example of a first film.

An example of the substrate 1 is a semiconductor substrate such as a silicon substrate. FIGS. 1A and 1B show an X direction and a Y direction that are parallel to a surface of the substrate 1 and are perpendicular to each other, and a Z direction that is perpendicular to the surface of the substrate 1. In the present specification, a +Z direction is regarded as an upward direction while a −Z direction is regarded as a downward direction. The −Z direction in the present embodiment may or may not coincide with a gravity direction.

The underlying layer 2 is formed on the substrate 1. An example of the underlying layer 2 is a gate insulator, a gate electrode, an interconnect layer, a plug layer or an inter layer dielectric on the substrate 1.

The convex portions P in the present embodiment are interconnect patterns, are adjacent to each other in the X direction, and extend in the Y direction. An example of the interconnects 3 is metal interconnects such as aluminum (Al) interconnects or copper (Cu) interconnects. An example of the first insulator 4 is a silicon nitride film (SiN). The convex portions P are formed by, for example, forming a material for the interconnects 3 and the first insulator 4 on the underlying layer 2 in order and processing the first insulator 4 and the material for the interconnect 3 by etching.

Figure 2B:
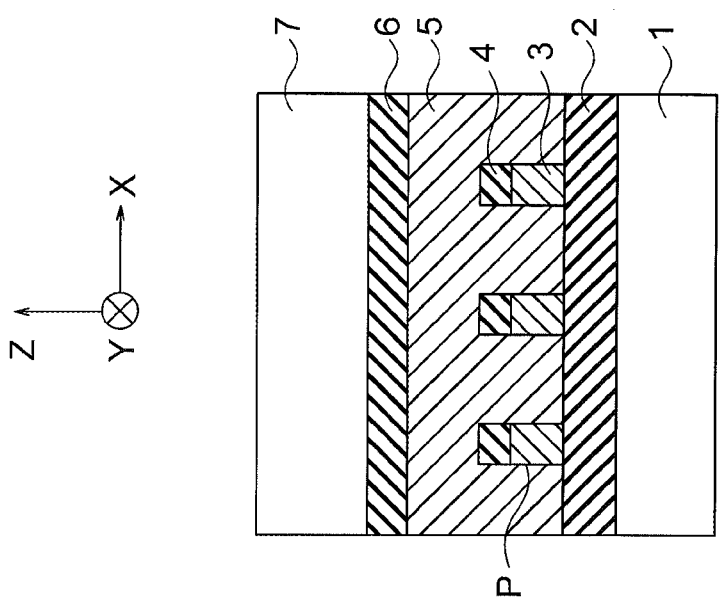
Figure 2A:
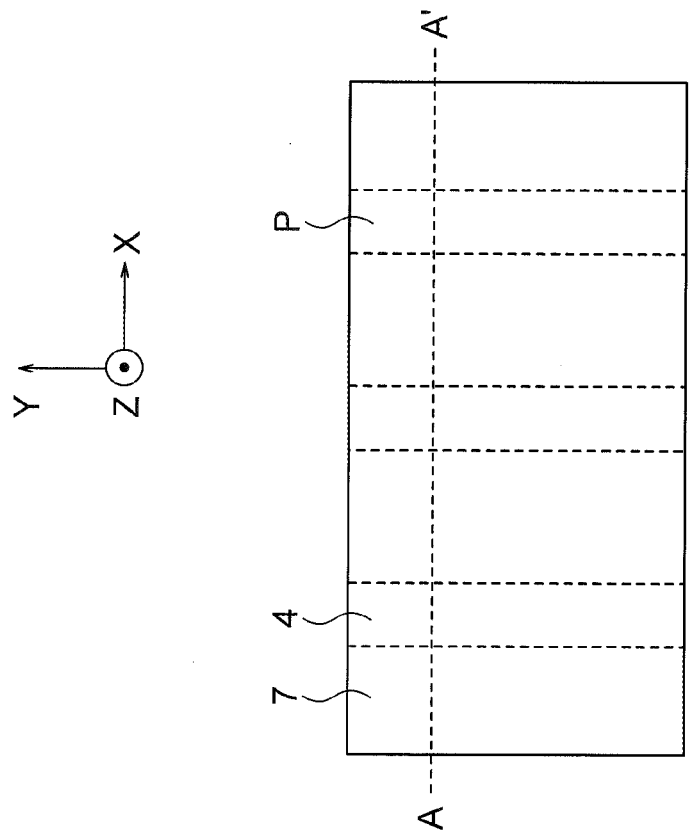

Next, a planarization film 5, an antireflection coating 6 and a resist film 7 are formed on the underlying layer 2 in order so as to cover the convex portions P (FIGS. 2A and 2B). The planarization film 5 is, for example, a spin on carbon (SOC) film. The planarization film 5 is an example of a second film. The antireflection coating 6 is, for example, a spin on glass (SOG) film.

Next, the resist film 7 is processed by photolithography, the antireflection coating 6 and the planarization film 5 are processed by reactive ion etching (RIE) using the resist film 7, and the resist film 7 and the antireflection coating 6 are then removed (FIGS. 3A and 3B). As a result, a concave portion T is formed in the planarization film 5.

The concave portion T in the present embodiment is a trench that extends approximately in the X direction and is formed across the convex portions P. The concave portion T in the present embodiment has first bottom faces $S_1$ that are upper faces of the first insulator 4 and second bottom faces $S_2$ that are upper faces of the underlying layer 2. The height of the second bottom faces $S_2$ is lower than that of the first bottom faces $S_1$. The first bottom faces $S_1$ are an example of a first bottom face and an example of a first upper face. The second bottom faces $S_2$ are an example of a second bottom face and an example of a second upper face. Reference character W denotes a width in the Y direction of the concave portion T. The width W in the present embodiment is equal to or smaller than 100 nm.

Figure 4B:
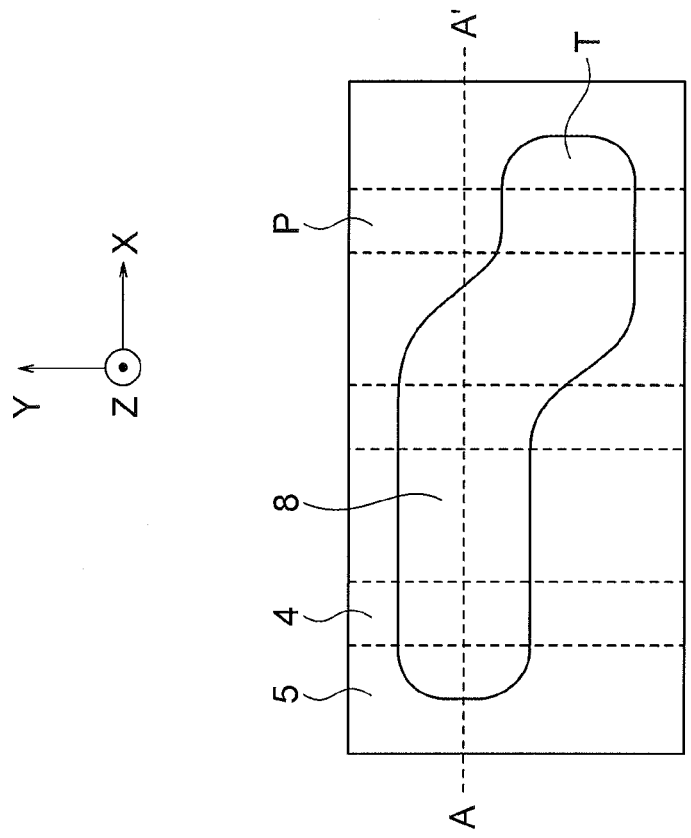
Figure 4A:
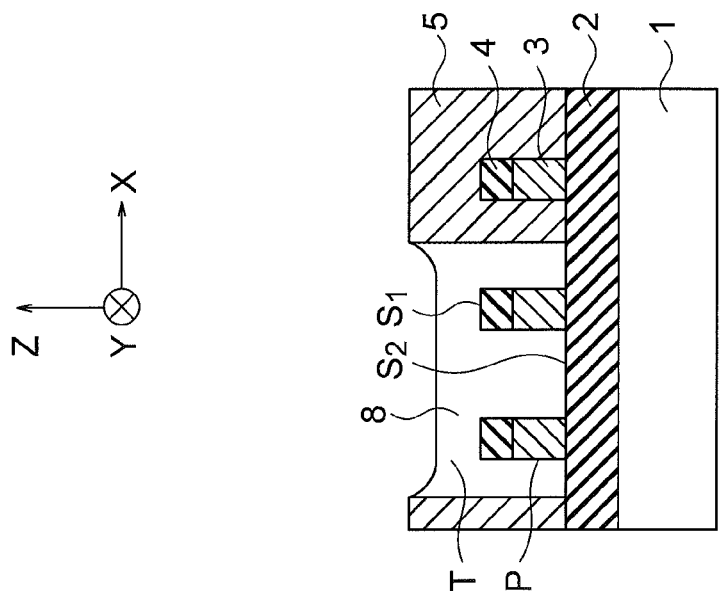

The whole surface of the substrate 1 is then coated with a liquid containing polymers to form a polymer film 8 in the concave portion T (FIGS. 4A and 4B). The polymers in the present embodiment is BCPs such as PS-b-PMMA (polystyrene-b-poly(methyl methacrylate)). Therefore, the polymer film 8 in the present embodiment is a BCP film.

Figure 15:
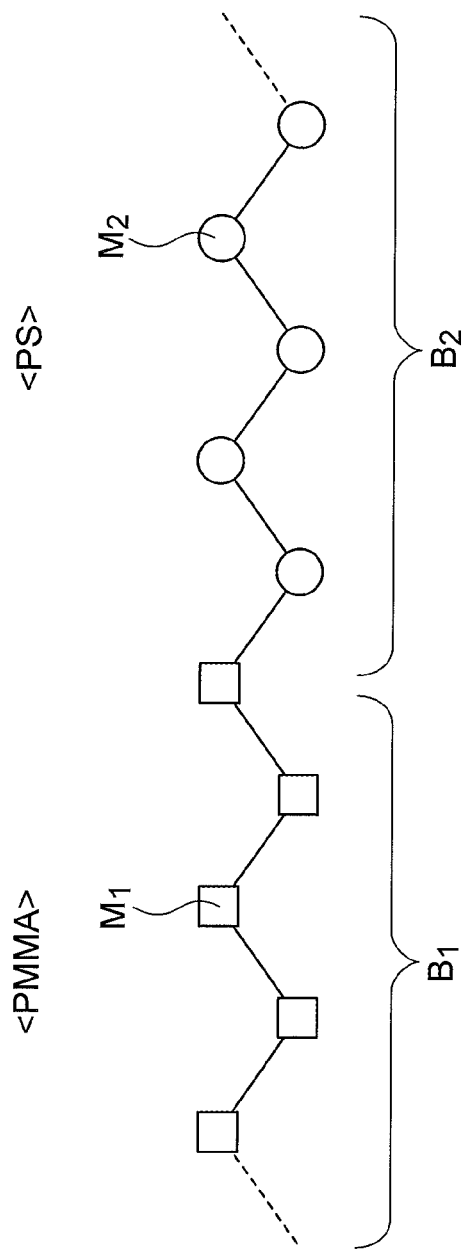
FIG. 15 is a schematic diagram showing a molecular structure of a BCP of the first embodiment.

FIG. 15 is a schematic diagram showing a molecular structure of a BCP of the present embodiment.

The BCP in the present embodiment includes a PMMA block $B_1$ that includes PMMA monomers $M_1$ and a PS block $B_2$ that includes PS monomers $M_2$. The PMMA monomers $M_1$ are an example of first monomers. The PMMA block $B_1$ is an example of a first portion and an example of a first polymer block. The PS monomers $M_2$ are an example of second monomers different in type from the first monomers. The PS block $B_2$ is an example of a second portion and an example of a second polymer block different in type from the first polymer block.

The compositional proportion of the PMMA monomers $M_1$ to the BCP in the present embodiment is equal to or smaller than 40% while the compositional proportion of the PS monomers $M_2$ to the BCP in the present embodiment is equal to or larger than 60%. More specifically, the composition ratio of the PMMA monomers $M_1$ and the PS monomers $M_2$ is, for example, about 3:7 or 4:6. With this composition, cylindrical phases can be produced in the BCP film in the present embodiment, as will be described later. The pitch between adjacent cylindrical phases is determined by, for example, the molecular weights, the composition ratio an interaction parameter (called the Flory-Huggins parameter, "$\chi$"), the temperature of heat treatment and the like of the PMMA block $B_1$ and the PS block $B_2$.

The first insulator 4 in the present embodiment is a silicon nitride film. The PMMA block $B_1$ has a first affinity for the silicon nitride film. The PS block $B_2$ has a second affinity lower than the first affinity for the silicon nitride film. Therefore, the PMMA block $B_1$ has a tendency to move closer to the first insulator 4, and the PS block $B_2$ consequently has a tendency to move away from the first insulator 4.

The first and second affinities can be defined by the angles of contact of PMMA and PS with the first insulator 4, like a hydrophilic property and a hydrophobic property of a substance. In the present embodiment, the angle of contact of PMMA with the first insulator 4 is smaller than the angle of contact of PS with the first insulator 4.

Although the polymer in FIG. 15 is a diblock copolymer, any other polymer can be used in the present embodiment. Examples of such a polymer are a triblock copolymer that includes one PMMA block $B_1$ and two PS blocks $B_2$, and a star polymer that includes two PMMA blocks $B_1$ and two PS blocks $B_2$.

Explanations on the method of manufacturing the semiconductor device of the present embodiment will be continued below with respect to FIGS. 5A to 6B.

Next, the polymer film 8 is heated to phase-separate the PMMA blocks $B_1$ and the PS blocks $B_2$ (FIGS. 5A and 5B). As a result, first patterns 8a that contain the PMMA blocks $B_1$ and a second pattern 8b that contains the PS blocks $B_2$ are formed in the polymer film 8. The heat treatment is performed at 250° C. in a nitrogen atmosphere for 5 minutes. The positions, sizes and shapes of the first patterns 8a are determined by the molecular weights and the composition ratio of the PMMA blocks $B_1$ and the PS blocks $B_2$, the shape and dimensions of the concave portion T in the planarization film 5 and the like.

In the present embodiment, the PMMA blocks $B_1$ have a tendency to move closer to the first insulator 4, and the PS blocks $B_2$ have a tendency to move away from the first insulator 4. For this reason, the first patterns 8a are formed mainly on the first bottom faces $S_1$ that are the upper faces of the first insulator 4, and the second pattern 8b is formed mainly on the second bottom faces $S_2$ that are the upper faces of the underlying layer 2. The upper faces of the underlying layer 2 in the present embodiment are formed of an insulator other than a silicon nitride film (e.g., a silicon oxide film).

FIG. 5B shows planar shapes of the first and second patterns 8a and 8b. According to the present embodiment, columnar patterns called cylindrical phases can be formed as the first patterns 8a. At this time, the concave portion T in the planarization film 5 functions as a guide for adjusting the positions and shapes of the first patterns 8a. The concave portion T in the present embodiment is formed across the positions intended for interconnect cutting or plug formation at the convex portions P.

Figure 6B:
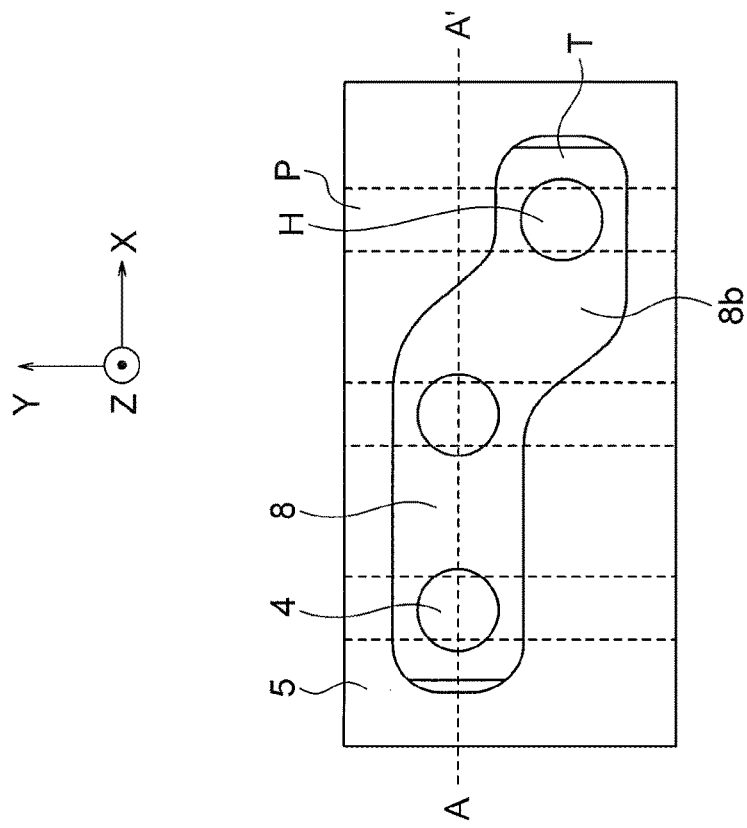
Figure 6A:
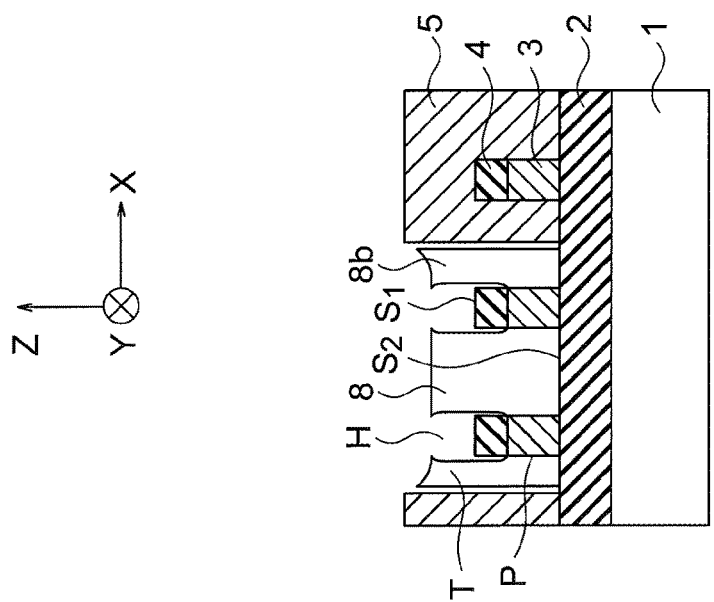

The first patterns 8a among the first and second patterns 8a and 8b are then selectively removed by development processing of the polymer film 8 (FIGS. 6A and 6B). As a result, openings (hole patterns) H are formed on the convex portions P in the polymer film 8. The width of the openings H in the present embodiment is, for example, equal to or smaller than 30 nm. As will be described later, the openings H can be used for the interconnect cutting or plug formation.

As described above, the first insulator 4 that has a high affinity for the PMMA blocks $B_1$ and a low affinity for the PS blocks $B_2$ is formed on each interconnect 3 in the present embodiment. With this configuration, the first patterns 8a are likely to be formed on the first bottom faces $S_1$ while the second pattern 8b is likely to be formed on the second bottom faces $S_2$ in the present embodiment. Therefore, the present embodiment makes it possible to inhibit positional shifts of the first patterns 8a on the convex portions P and to improve the yield for the interconnect cutting or plug formation.

Additionally, in the present embodiment, the respective interconnects 3 form the convex portions P, and the first bottoms faces $S_1$ are higher than the second bottom faces $S_2$. Therefore, the distance between the first bottom faces $S_1$ and the second bottom faces $S_2$ in the present embodiment is longer than that in a case where the first bottom faces $S_1$ are the same in height as the second bottom faces $S_2$. If the distance between the first bottom faces $S_1$ and the second bottom faces $S_2$ is short, the first patterns 8a are more likely to be shifted from the first bottom faces $S_1$ to the second bottom faces $S_2$. However, according to the present embodiment, a large distance can be secured as the distance between the first bottom faces $S_1$ and the second bottom faces $S_2$, which can inhibit the above-described positional shifts.

A film other than a silicon nitride film may be used as the first film (the first insulator 4) in the present embodiment as long as the film has a high affinity for the PMMA block $B_1$ and a low affinity for the PS block $B_2$. In this case, the film may be an insulator or something other than an insulator. Examples of such a film are a silicon oxide film ($SiO_2$), a polysilicon film, an amorphous silicon film and a metal oxide film. However, the affinities of these films for the PMMA block $B_1$ and the PS block $B_2$ are often not most suitable as those of the first film. In this case, it is possible, by treating surfaces of these films by etching such as RIE, to make the affinities of these films more suitable as those of the first film, and to use these films as the first film.

Before the step shown in FIGS. 4A and 4B is executed, a neutralization film that has equivalent affinities for the PMMA blocks $B_1$ and the PS blocks $B_2$ may be formed in a region that includes the second bottom faces $S_2$ and does not include the first bottom faces $S_1$. For example, after the neutralization film is formed by coating and subjected to heat treatment, an unreacted portion is removed by rinsing to form a thin neutralization film. In the present embodiment, a material that does not react with the first insulator 4 is used as the material for the neutralization film in order to form the neutralization film in the region that does not include the first bottom faces $S_1$. The use of the neutralization film can reduce effects of the second bottom faces $S_2$ on the positions of the first patterns 8a.

Before the step shown in FIGS. 4A and 4B is executed, a pinning film of an organic material that has a high affinity for the PMMA blocks $B_1$ and a low affinity for the PS blocks $B_2$ may also be formed on the first bottom faces $S_1$. For example, after the pinning film is formed by coating and subjected to heat treatment, an unreacted portion is removed by rinsing to form a thin pinning film. In the present embodiment, a material that reacts with the first insulator 4 and does not react with the underlying layer 2, the interconnect 3 and the planarization film 5 is used as the material for the pinning film in order to form the pinning film on the first bottom faces $S_1$. It is possible, by adjusting the affinity of the pinning film for the PMMA blocks $B_1$ to be most suitable, to inhibit the positional shifts of the first patterns 8a even if the affinity of the first bottom faces $S_1$ for the PMMA blocks $B_1$ is not most suitable. Also, it is possible, by not using the first insulator 4 but using the pining film of the material that reacts with the interconnect 3 and does not react with the underlying layer 2 and the planarization film 5 before and after the step shown in FIGS. 4A and 4B, to form the pinning film on the interconnects 3 and to inhibit the positional shifts of the first patterns 8a. Such a pinning film is also an example of the first film.

In the present embodiment, the first insulator 4 that has a low affinity for the PMMA blocks $B_1$ and a high affinity for the PS blocks $B_2$ may also be used. Alternatively, a pinning film of an organic material that has a low affinity for the PMMA blocks $B_1$ and a high affinity for the PS blocks $B_2$ may be formed. In this case, the PS blocks $B_2$ form the first patterns 8a while the PMMA blocks $B_1$ form the second pattern 8b. Since the PMMA blocks $B_1$ are generally easier to remove than the PS blocks $B_2$, it is more desirable to use the first insulator 4 or the pinning film that causes the PMMA blocks $B_1$ to form the first patterns 8a.

Second Embodiment

Figure 7B:
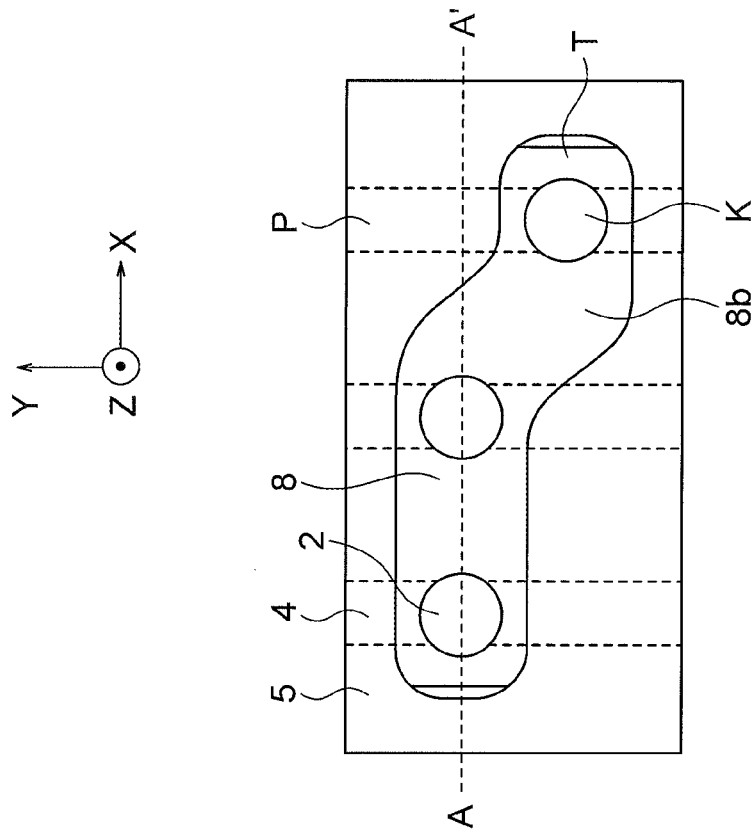
Figure 7A:
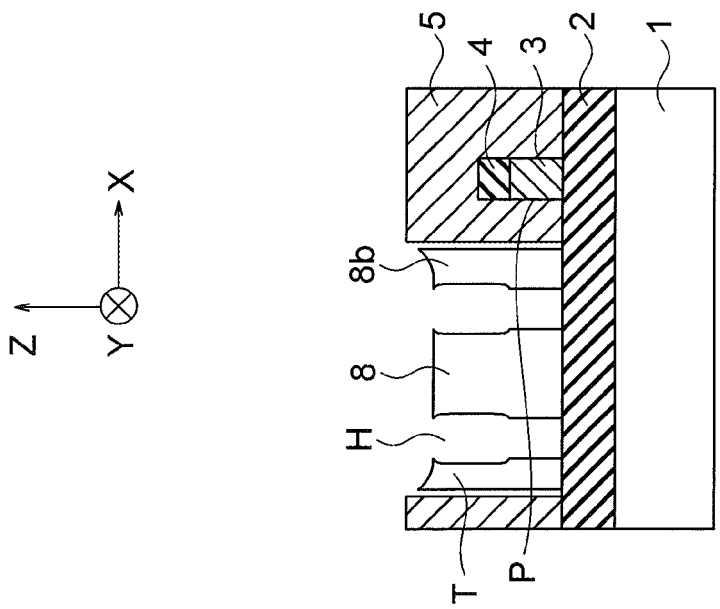

FIGS. 7A to 9B are cross-sectional views and plan views showing a method of manufacturing a semiconductor device of a second embodiment. The cross-sectional view in FIG. 7A shows a cross-section taken along line A-A' in the plan view in FIG. 7B. The same applies to FIGS. 8A to 9B.

After the step in FIGS. 6A and 6B, the first insulator 4 exposed in the openings H is removed by RIE (FIGS. 7A and 7B). The interconnects 3 exposed in the openings H are then removed by RIE (FIGS. 7A and 7B). As a result, each interconnect 3 is divided at the position denoted by reference character K.

Figure 9B:
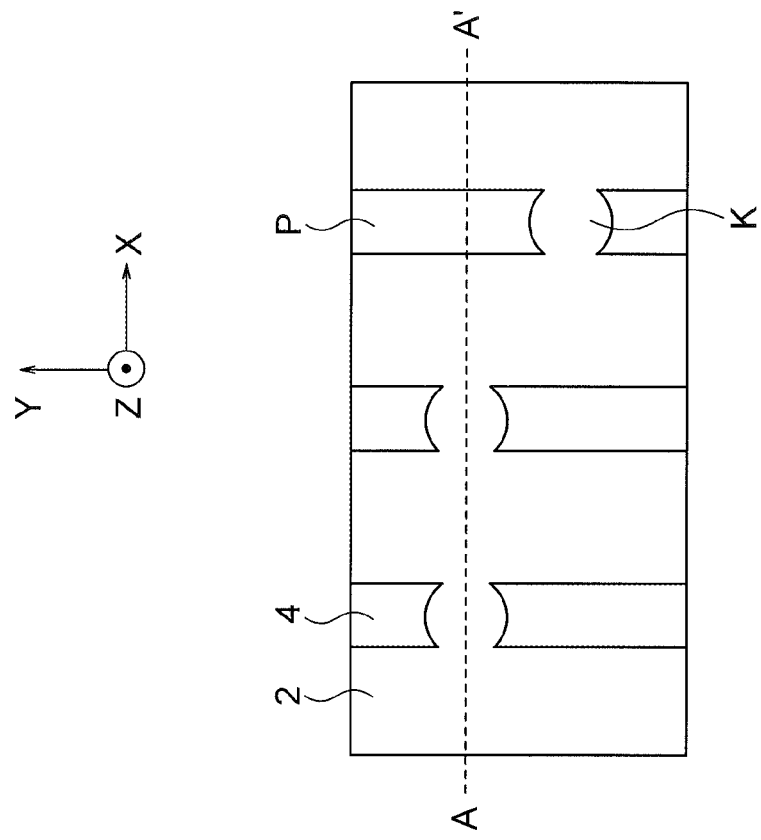
Figure 9A:
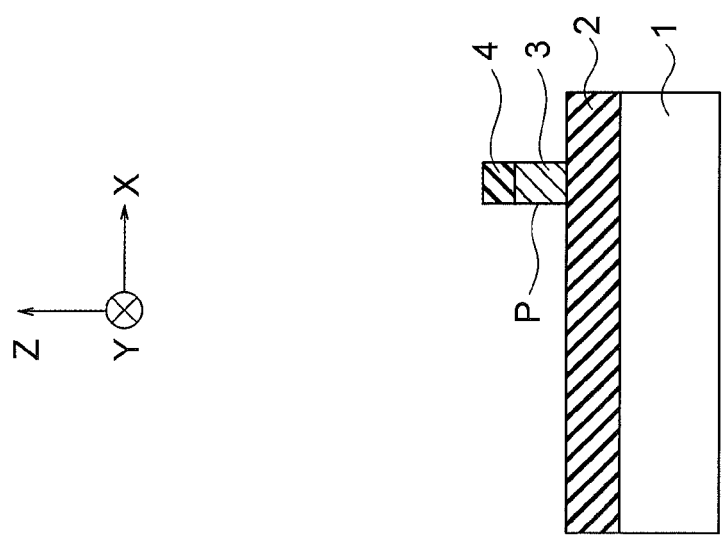

Next, the polymer film 8 is removed (FIGS. 8A and 8B). The planarization film 5 is then removed (FIGS. 9A and 9B). In this manner, the interconnect cutting of the present embodiment is performed.

Figure 16B:
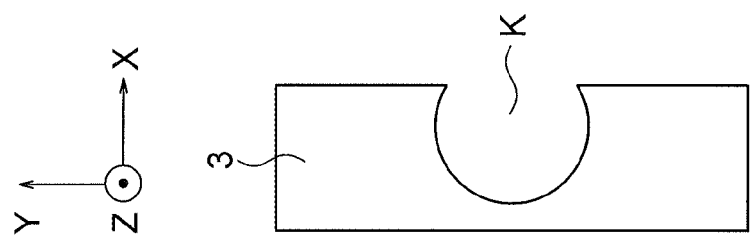
FIGS. 16A and 16B are plan views for explaining interconnect cutting of the second embodiment.
Figure 16A:
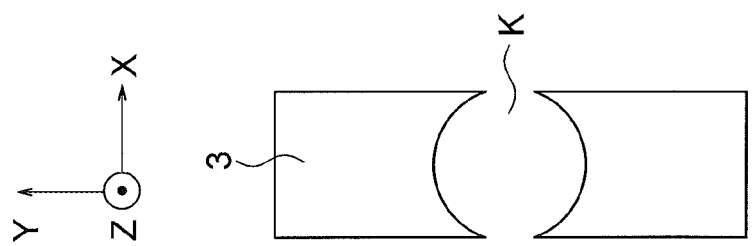

FIGS. 16A and 16B are plan views for explaining the interconnect cutting of the second embodiment.

FIG. 16A shows appropriate interconnect cutting while FIG. 16B shows inappropriate interconnect cutting. The cut position of the interconnect 3 in FIG. 16B is shifted in the X direction from the cut position of the interconnect 3 in FIG. 16A. For this reason, the interconnect 3 in FIG. 16B is not completely cut.

As described above, the present embodiment can inhibit the positional shifts of the first patterns 8a on the convex portions P. For this reason, the present embodiment can inhibit the shifts of the cut positions in the interconnects 3 as in FIG. 16B. Therefore, the present embodiment can improve the yield for the interconnect cutting.

Third Embodiment

FIGS. 10A to 10D are cross-sectional views showing a method of manufacturing a semiconductor device of a third embodiment.

Figure 10A:
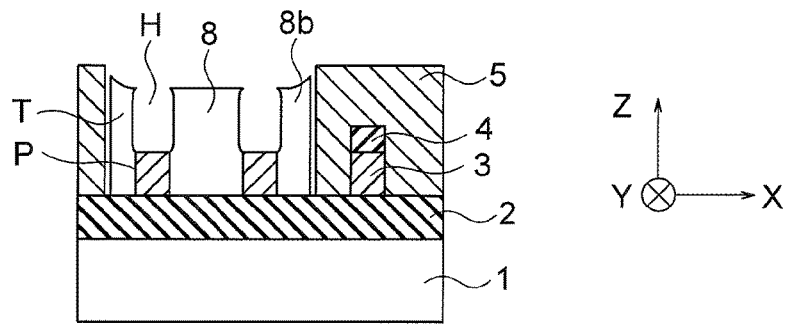
FIGS. 10A to 10D are cross-sectional views showing a method of manufacturing a semiconductor device of a third embodiment.

First, after the step in FIGS. 6A and 6B, the first insulator 4 exposed in the openings H is removed by RIE (FIG. 10A). As a result, the interconnects 3 are exposed in the openings H.

Figure 10B:
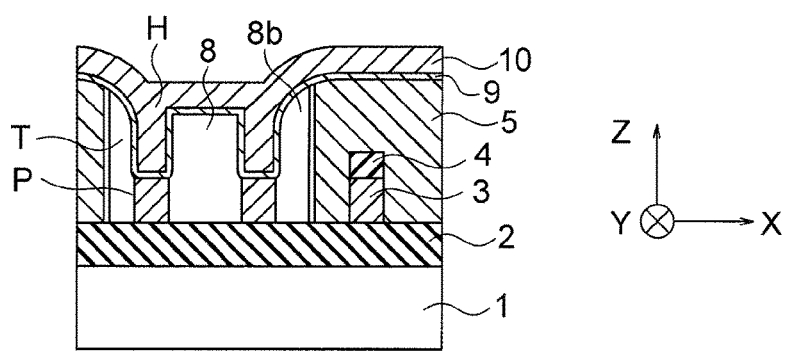

Next, a barrier metal layer 9 and a plug material layer 10 are formed in order on the whole surface of a substrate 1 (FIG. 10B). As a result, the barrier metal layer 9 is formed on bottom faces and side faces of the openings H, and the plug material layer 10 is formed in the openings H via the barrier metal layer 9. An example of the barrier metal layer 9 is a titanium nitride film (TIN). An example of the plug material layer 10 is a tungsten (W) layer.

A general formation method of the barrier metal layer 9 and the plug material layer 10 is chemical vapor deposition (CVD). However, when CVD is used, the barrier metal layer 9 and the plug material layer 10 generally need to be formed at a temperature higher than 300° C. If an organic film such as the polymer film 8 is heated at a high temperature, it is difficult to form the steady barrier metal layer 9 and plug material layer 10 due to, for example, an escape of a gas from the polymer film 8. For this reason, the barrier metal layer 9 and the plug material layer 10 in the present embodiment are desirably formed by, for example, electroless plating. The present embodiment makes it possible, by using electroless plating, to form the barrier metal layer 9 and the plug material layer 10 at a lower temperature equal to or lower than 300° C.

Figure 10C:
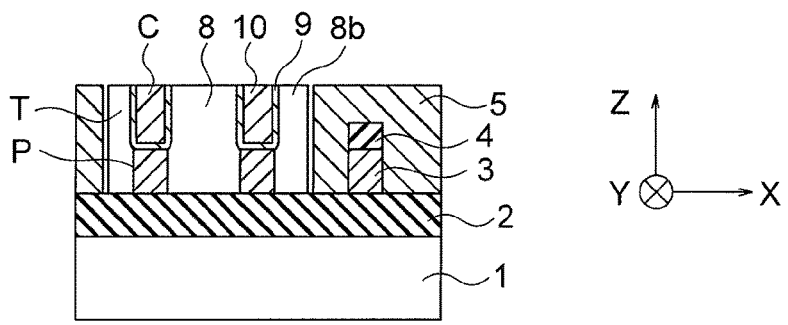

Next, surfaces of the plug material layer 10, the barrier metal layer 9, the polymer film 8 and the planarization film 5 are planarized by chemical mechanical polishing (CMP) (FIG. 10C). As a result, contact plugs C that include the barrier metal layer 9 and the plug material layer 10 is formed on the interconnects 3 in the openings H. The contact plugs C are an example of a plug, and the barrier metal layer 9 and the plug material layer 10 are an example of a material for the plug.

Figure 10D:
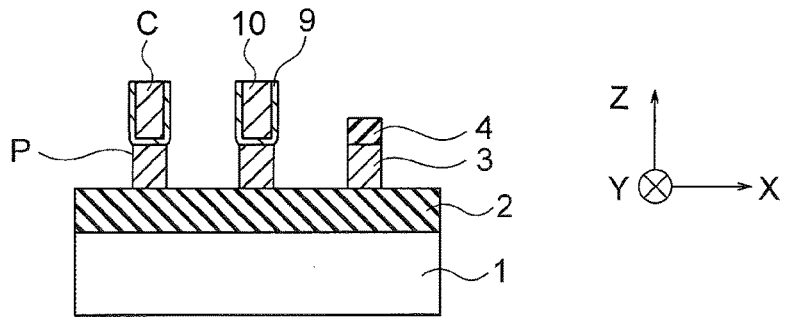

The polymer film 8 and the planarization film 5 are then removed by ashing (FIG. 10D). In this manner, the plug formation of the present embodiment is performed.

The present embodiment makes it possible to inhibit the positional shifts of the first patterns 8a on the convex portions P and to improve the yield for the plug formation, similarly to the first and second embodiments.

Fourth Embodiment

FIGS. 11A to 12D are cross-sectional views showing a method of manufacturing a semiconductor device of a fourth embodiment.

Figure 11A:
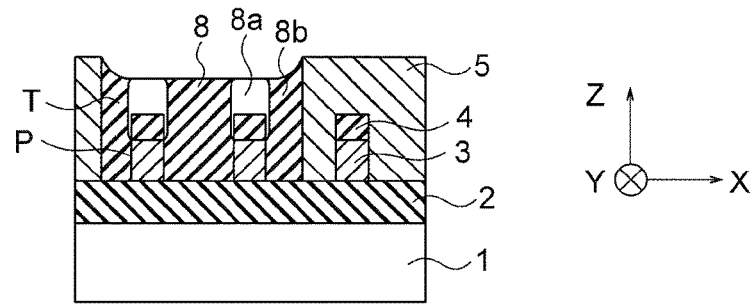
FIGS. 11A to 12D are cross-sectional views showing a method of manufacturing a semiconductor device of a fourth embodiment.

The steps in FIGS. 1A to 5B are first executed to form the structure in FIG. 11A. However, an aluminum oxide film (AlO) is used as the first insulator 4 in the present embodiment. An aluminum oxide film has a lower affinity for the PMMA blocks $B_1$ than an affinity for the PS blocks $B_2$. Therefore, in the present embodiment, the PS blocks $B_2$ form the first patterns 8a while the PMMA blocks $B_1$ form the second pattern 8b. The first patterns 8a are formed mainly on the first bottom faces $S_1$ that are the upper faces of the first insulator 4, and the second pattern 8b is formed mainly on the second bottom faces $S_2$ that are the upper faces of the underlying layer 2. The upper faces of the underlying layer 2 in the present embodiment are formed of an insulator other than an aluminum oxide film (e.g., a silicon oxide film).

The first film (the first insulator 4) in the present embodiment may be a film other than the aluminum oxide film as long as the affinity for the PMMA blocks $B_1$ is lower than the affinity for the PS blocks $B_2$. In this case, this film may be an insulator or something other than an insulator. Examples of such a film are an SiOC film, an SiOCH film, an SiOF film and a HfO film where Si, O, C, H, F and Hf represent silicon, oxygen, carbon, hydrogen, fluorine and hafnium, respectively.

In the present embodiment, the PS monomers $M_2$ are an example of the first monomer, and the PMMA monomers $M_1$ are an example of the second monomer (see FIG. 15). The PS blocks $B_2$ are an example of the first portion and an example of the first polymer block. The PMMA blocks $B_1$ are an example of the second portion and an example of the second polymer block.

Figure 11B:
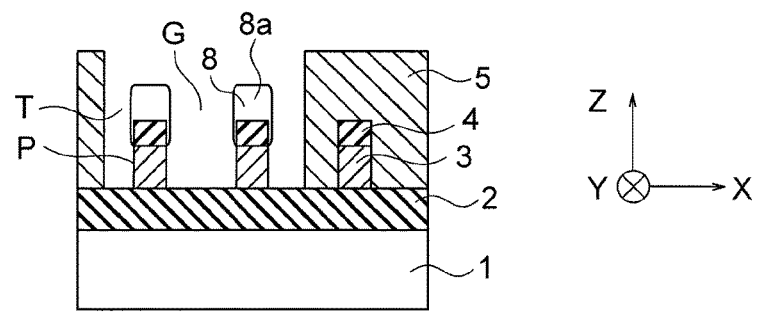

Next, the second pattern 8b among the first and second patterns 8a and 8b is selectively removed by development processing of the polymer film 8 (FIG. 11B). As a result, an opening G is formed in the polymer film 8.

Figure 11C:
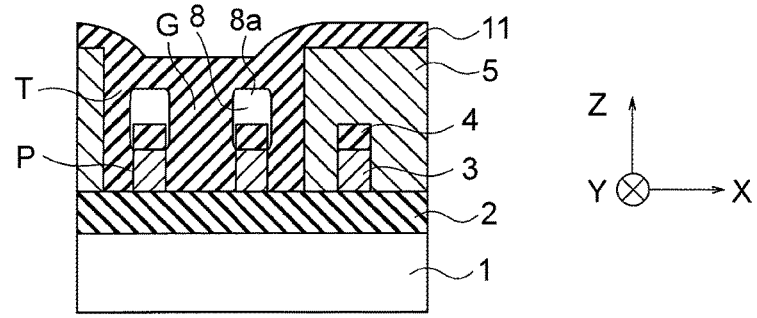

A second insulator 11 is then formed on the whole surface of the substrate 1 (FIG. 11C). As a result, the second insulator 11 is formed in the opening G. The second insulator 11 is, for example, a coating-type low-k film. The second insulator 11 is an example of a third film.

Figure 11D:
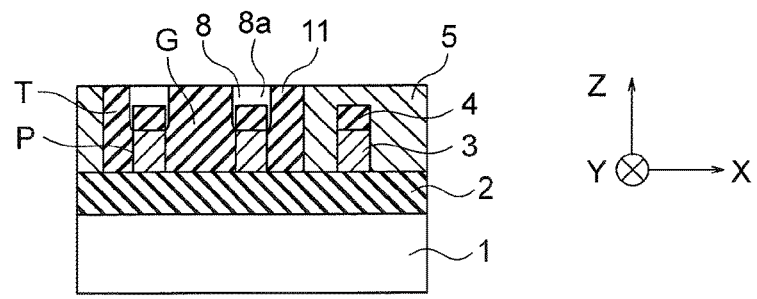

Surfaces of the second insulator 11, the polymer film 8 and the planarization film 5 are planarized by CMP (FIG. 11D). As a result, the first patterns 8a on the convex portions P are exposed.

Figure 12A:
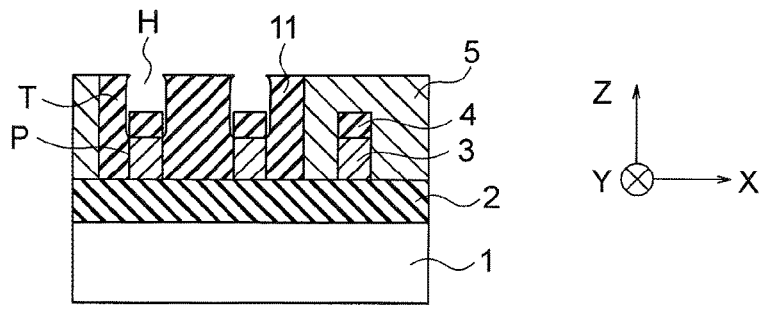

Next, the first patterns 8a on the convex portions P are removed by RIE (FIG. 12A). As a result, the openings (hole patterns) H are formed on the convex portions P.

Figure 12B:
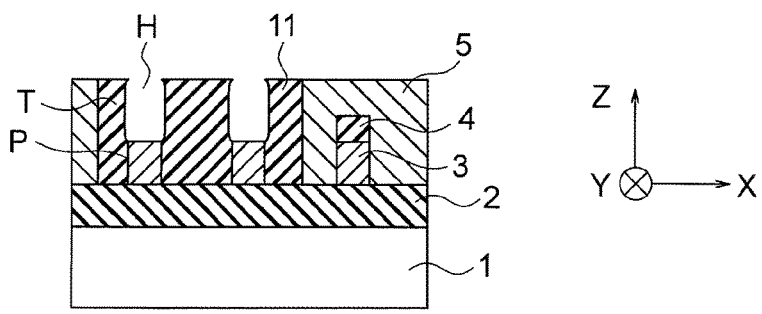

The first insulator 4 exposed in the openings H is then removed by RIE (FIG. 12B). As a result, the interconnects 3 are exposed in the openings H.

Figure 12C:
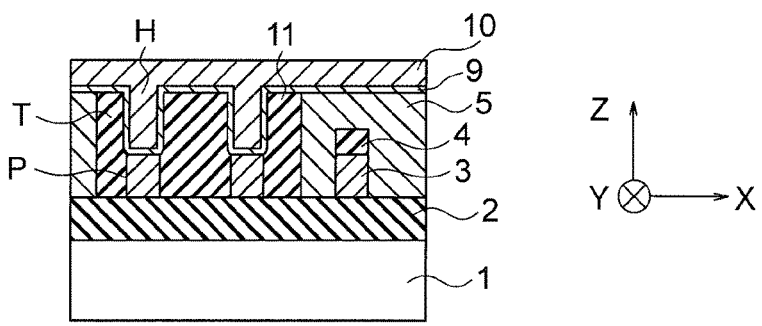

The barrier metal layer 9 and the plug material layer 10 are formed in order on the whole surface of the substrate 1 (FIG. 12C). As a result, the barrier metal layer 9 is formed on the bottom faces and the side face of the openings H, and the plug material layer 10 is formed in the openings H via the barrier metal layer 9. Examples of the barrier metal layer 9 and the plug material layer 10 are as described above. The barrier metal layer 9 and the plug material layer 10 are desirably formed by electroless plating. This makes it possible to form the barrier metal layer 9 and the plug material layer 10 at a low temperature equal to or lower than 300° C.

Figure 12D:
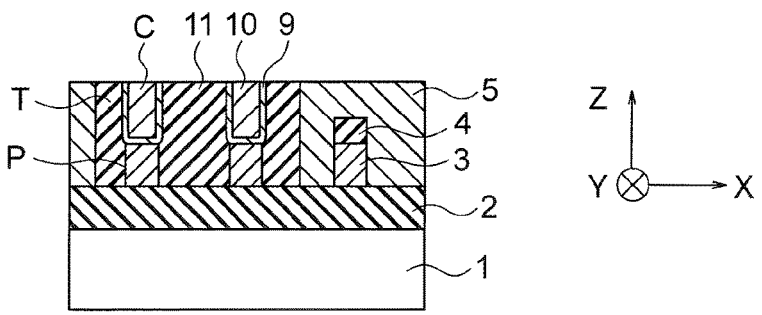

Surfaces of the plug material layer 10 and the barrier metal layer 9 are then planarized by CMP (FIG. 12D). As a result, the contact plugs C that include the barrier metal layer 9 and the plug material layer 10 are formed on the interconnects 3 in the openings H. The planarization film 5 is then removed by ashing, similarly to the third embodiment.

The present embodiment makes it possible to inhibit the positional shifts of the first patterns 8a on the convex portions P and to improve the yield for the plug formation, similarly to the third embodiment.

The method of manufacturing a semiconductor device of the present embodiment can be applied not only to the plug formation but also to the interconnect cutting. In this case, the step in FIGS. 7A and 7B is performed instead of the steps in FIGS. 12A to 12D.

Fifth Embodiment

FIGS. 13A to 14C are cross-sectional views showing a method of manufacturing a semiconductor device of a fifth embodiment.

Figure 13A:
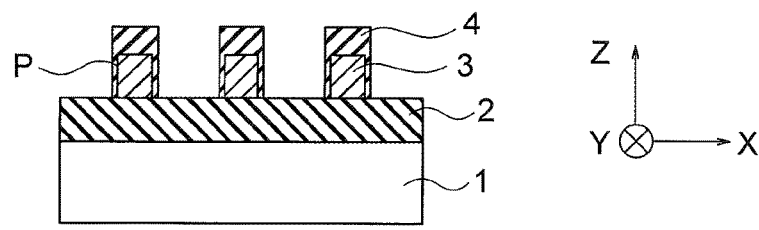
FIGS. 13A to 14C are cross-sectional views showing a method of manufacturing a semiconductor device of a fifth embodiment.

The underlying layer 2 is first formed on the substrate 1, and the convex portions P are formed on the underlying layer 2 (FIG. 13A). Each convex portion P in the first to fourth embodiments includes an interconnect 3 formed on the upper face of the underlying layer 2, and a first insulator 4 formed on the upper face of the interconnect 3. In contrast, each convex portion P in the present embodiment includes an interconnect 3 formed on the upper face of the underlying layer 2, and a first insulator 4 formed on the upper face and side faces of the interconnect 3. The convex portions P in the present embodiment are formed by forming the interconnects 3 on the underlying layer 2, forming the first insulator 4 on the underlying layer 2 such that the first insulator 4 covers the interconnects 3, and processing the first insulator 4 by etch back.

The convex portions P in the present embodiment are the interconnect patterns, are adjacent to each other in the X direction, and extend in the Y direction. An example of the interconnects 3 are polysilicon interconnects. An example of the first insulator 4 is a silicon nitride film.

Figure 13B:
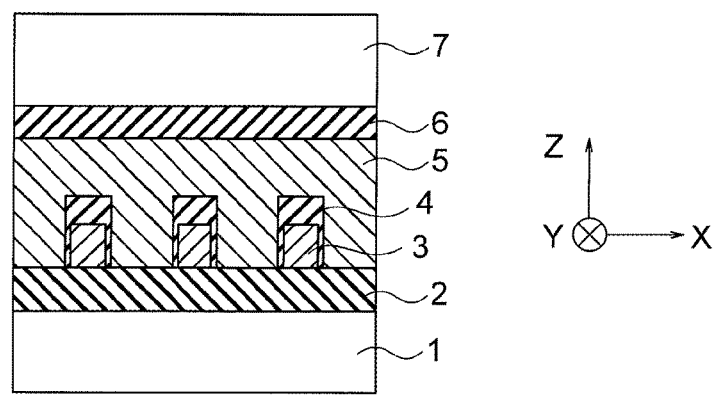

Next, the planarization film 5, the antireflection coating 6 and the resist film 7 are formed in order on the underlying layer 2 so as to cover the convex portions P (FIG. 13B).

Figure 13C:
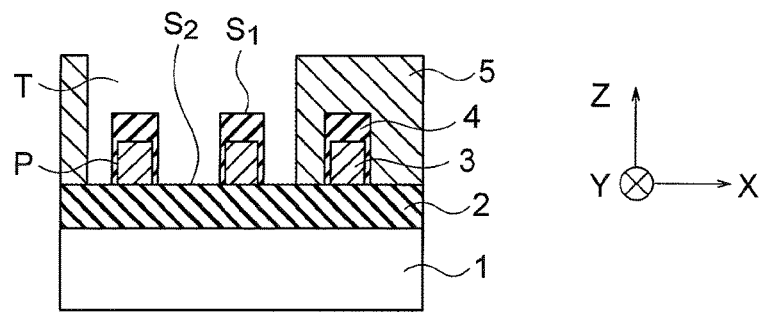

Next, the resist film 7 is processed by photolithography, the antireflection coating 6 and the planarization film 5 are processed by RIE using the resist film 7, and the resist film 7 and the antireflection coating 6 are then removed (FIG. 13C). As a result, the concave portion T is formed in the planarization film 5.

Figure 14A:
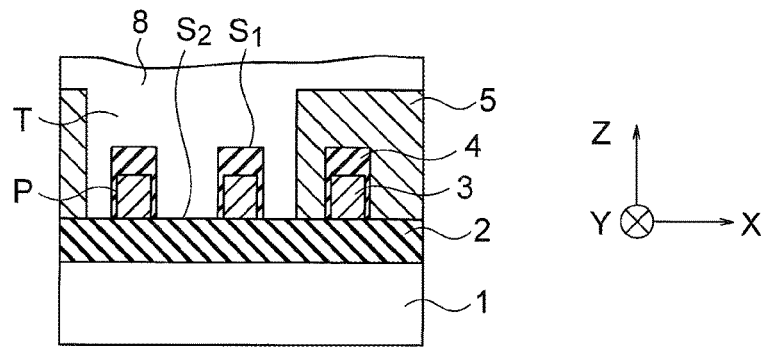

The whole surface of the substrate 1 is then coated with the liquid containing the polymers to form the polymer film 8 in the concave portion T (FIG. 14A). The polymers in the present embodiment are the BCPs such as PS-b-PMMA. Therefore, the polymer film 8 in the present embodiment is the BCP film. The polymer film 8 in the present embodiment is formed inside and outside the concave portion T.

Figure 14B:
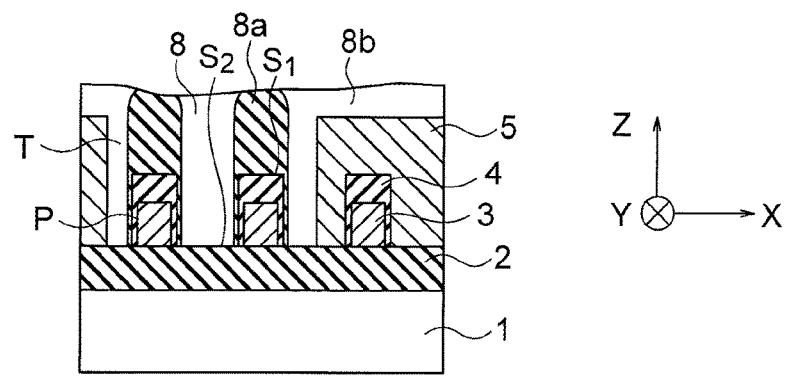

The polymer film 8 is then heated to phase-separate the PMMA blocks $B_1$ and the PS blocks $B_2$ (FIG. 14B). As a result, the first patterns 8a that contains the PMMA blocks $B_1$ and the second pattern 8b that contains the PS blocks $B_2$ are formed in the polymer film 8.

Figure 14C:
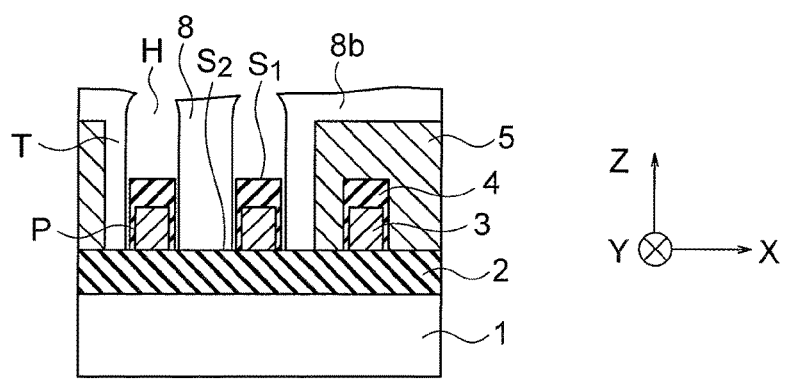

The first patterns 8a among the first and second patterns 8a and 8b are then selectively removed by development processing of the polymer film 8 (FIG. 14C). As a result, the openings (hole patterns) H are formed on the convex portions P in the polymer film 8. As described in the second and third embodiments, the openings H can be used for the interconnect cutting or the plug formation.

The present embodiment makes it possible to inhibit the positional shifts of the first patterns 8a on the convex portions P and to improve the yield for the interconnect cutting or the plug formation, similarly to the first to fourth embodiments.

The shapes of the convex portions P in the present embodiment can be applied not only to the first embodiment but also to the second to fourth embodiments.

While certain embodiments have been described, these embodiments have been presented by way of example only, and are not intended to limit the scope of the inventions. Indeed, the novel methods described herein may be embodied in a variety of other forms; furthermore, various omissions, substitutions and changes in the form of the methods described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device, comprising:
    forming a convex portion above a substrate, the convex portion including an interconnect and a first film;
    forming a second film on the convex portion;
    forming a concave portion in the second film, the concave portion having a first bottom face that is an upper face of the first film and a second bottom face that is lower than the upper face of the first film;
    forming a polymer film in the concave portion by using a polymer that includes a first portion having a first affinity for the first film and a second portion having a second affinity lower than the first affinity for the first film;
    phase-separating the first portion and the second portion to form a first pattern and a second pattern in the polymer film, the first pattern containing the first portion and being located on the first bottom face, the second pattern containing the second portion and being located on the second bottom face; and
    selectively removing the first or second pattern.

2. The method of claim 1, wherein
    the first portion includes first monomers, and
    the second portion includes second monomers different in type from the first monomers.

3. The method of claim 2, wherein
    a composition proportion of the first monomers to the polymer is equal to or smaller than 40%, and
    a composition proportion of the second monomers to the polymer is equal to or larger than 60%.

4. The method of claim 1, wherein
    the polymer is a block copolymer,
    the first portion is a first polymer block, and
    the second portion is a second polymer block different in type from the first polymer block.

5. The method of claim 1, wherein the first pattern that is a cylindrical phase is formed by the phase-separating.

6. The method of claim 1, wherein a width of the concave portion is equal to or smaller than 100 nm.

7. The method of claim 1, wherein the first film is an insulator.

8. The method of claim 1, wherein the first film is an SiN film, an $SiO_2$ film, an SiOC film, an SiOCH film, an SiOF film, a polysilicon film, an amorphous silicon film or a metal oxide film where Si, N, O, C, H and F represent silicon, nitrogen, oxygen, carbon, hydrogen and fluorine, respectively.

9. The method of claim 1, further comprising:
    selectively removing the first pattern to form an opening in the polymer film;
    removing the first film exposed in the opening; and
    removing the interconnect exposed in the opening to divide the interconnect.

10. The method of claim 1, further comprising:
    selectively removing the first pattern to form an opening in the polymer film;
    removing the first film exposed in the opening; and
    forming a plug on the interconnect exposed in the opening.

11. The method of claim 10, wherein the forming of the plug comprises forming a material for the plug on the interconnect by electroless plating.

12. The method of claim 10, wherein the forming of the plug comprises forming a material for the plug on the interconnect at 300° C. or lower.

13. The method of claim 1, further comprising:
    selectively removing the second pattern to form an opening in the polymer film;
    forming a third film in the opening;
    removing the first pattern and the first film after forming the third film to expose the interconnect; and
    forming a plug on the exposed interconnect.

14. The method of claim 13, wherein the forming of the plug comprises forming a material for the plug on the interconnect by electroless plating.

15. The method of claim 13, wherein the forming of the plug comprises forming a material for the plug on the interconnect at equal 300° C. or lower.

16. The method of claim 1, wherein the convex portion includes the interconnect and the first film that is formed on an upper face of the interconnect.

17. The method of claim 1, wherein the convex portion includes the interconnect and the first film that is formed on an upper face and a side face of the interconnect.

18. A method of manufacturing a semiconductor device, comprising:
    forming an interconnect provided above a substrate and a first film provided on the interconnect;
    forming a polymer film on a first upper face that is an upper face of the first film and a second upper face that is different from the upper face of the first film by using a polymer that includes a first portion having a first affinity for the first film and a second portion having a second affinity lower than the first affinity for the first film;
    phase-separating the first portion and the second portion to form a first pattern and a second pattern in the polymer film, the first pattern containing the first portion and being located on the first upper face, the second pattern containing the second portion and being located on the second upper face; and
    selectively removing the first or second pattern.

19. The method of claim 18, wherein the first film is an insulator.

20. The method of claim 18, wherein the first film is an SiN film, an $SiO_2$ film, an SiOC film, an SiOCH film, an SiOF film, a polysilicon film, an amorphous silicon film or a metal oxide film where Si, N, O, C, H and F represent silicon, nitrogen, oxygen, carbon, hydrogen and fluorine, respectively.

* * * * *